United States Patent
Chen et al.

(10) Patent No.: US 8,148,725 B2
(45) Date of Patent: Apr. 3, 2012

(54) LIGHT-EMITTING DEVICE AND REPAIRING METHOD THEREOF

(75) Inventors: Chieh-Wei Chen, Taichung County (TW); Yuan-Chun Wu, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 90 days.

(21) Appl. No.: 12/617,689

(22) Filed: Nov. 12, 2009

(65) Prior Publication Data
US 2011/0012135 A1 Jan. 20, 2011

(30) Foreign Application Priority Data
Jul. 17, 2009 (TW) .............................. 98124289 A

(51) Int. Cl.
*H01L 33/00* (2010.01)
(52) U.S. Cl. ....... 257/59; 257/72; 257/88; 257/E33.062; 257/E33.064; 257/E33.065; 257/E33.066
(58) Field of Classification Search .................. 257/40, 257/59, 72, 88, E33.062, E33.064, E33.065, 257/E33.066, E51.018, E51.019
See application file for complete search history.

(56) References Cited

U.S. PATENT DOCUMENTS

| 7,723,736 | B2 * | 5/2010 | Lee et al. | 257/88 |
| 7,928,653 | B2 * | 4/2011 | Oh | 313/509 |
| 2004/0032220 | A1 | 2/2004 | Cok et al. | |
| 2005/0174064 | A1 | 8/2005 | Agostinelli et al. | |
| 2007/0046186 | A1 * | 3/2007 | Kim | 313/504 |
| 2008/0179602 | A1 | 7/2008 | Negley et al. | |
| 2009/0195723 | A1 * | 8/2009 | Araki et al. | 349/43 |
| 2011/0175129 | A1 * | 7/2011 | Lee et al. | 257/98 |
| 2011/0233574 | A1 * | 9/2011 | Lee et al. | 257/88 |
| 2011/0241054 | A1 * | 10/2011 | Lee et al. | 257/98 |

FOREIGN PATENT DOCUMENTS

| TW | 200701834 | 1/2007 |
| TW | I296894 | 5/2008 |

* cited by examiner

*Primary Examiner* — Victor A Mandala
(74) *Attorney, Agent, or Firm* — Jianq Chyun IP Office

(57) ABSTRACT

A light-emitting device including a plurality of light-emitting units is provided. Each of the light-emitting units includes a first common electrode layer, a plurality of light-emitting layers, and a second common electrode layer. The first common electrode layer includes a bridge conductive line and a plurality of first electrode patterns electrically insulated from each other, in which the first electrode patterns cover a portion of the bridge conductive line and are electrically connected to each other through the bridge conductive line. Each of the light-emitting layers is disposed on one of the first electrode patterns. The second common electrode layer is disposed on the light-emitting layers, in which the first common electrode layer of each of the light-emitting units is electrically connected to the second common electrode layer of an adjacent light-emitting unit.

25 Claims, 13 Drawing Sheets

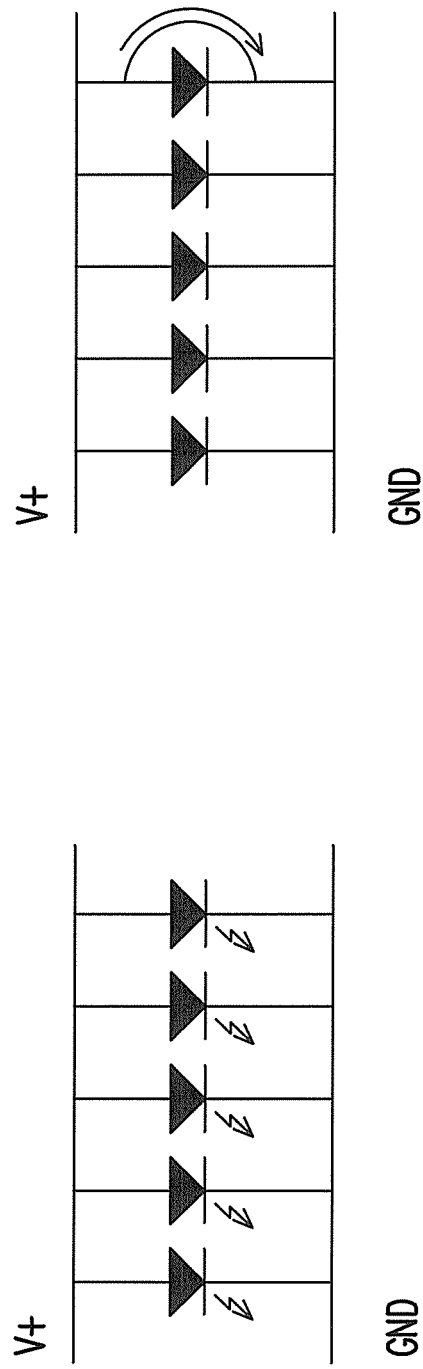

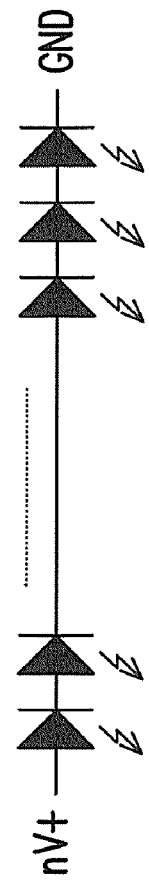
FIG. 2A (RELATED ART)  FIG. 2B (RELATED ART)  FIG. 2C (RELATED ART)

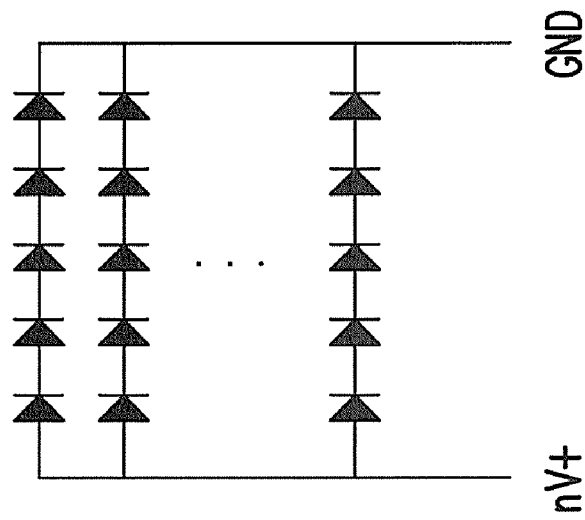
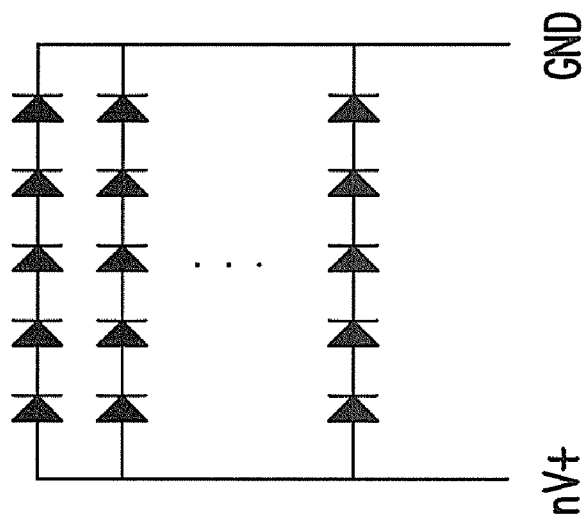
FIG. 3'

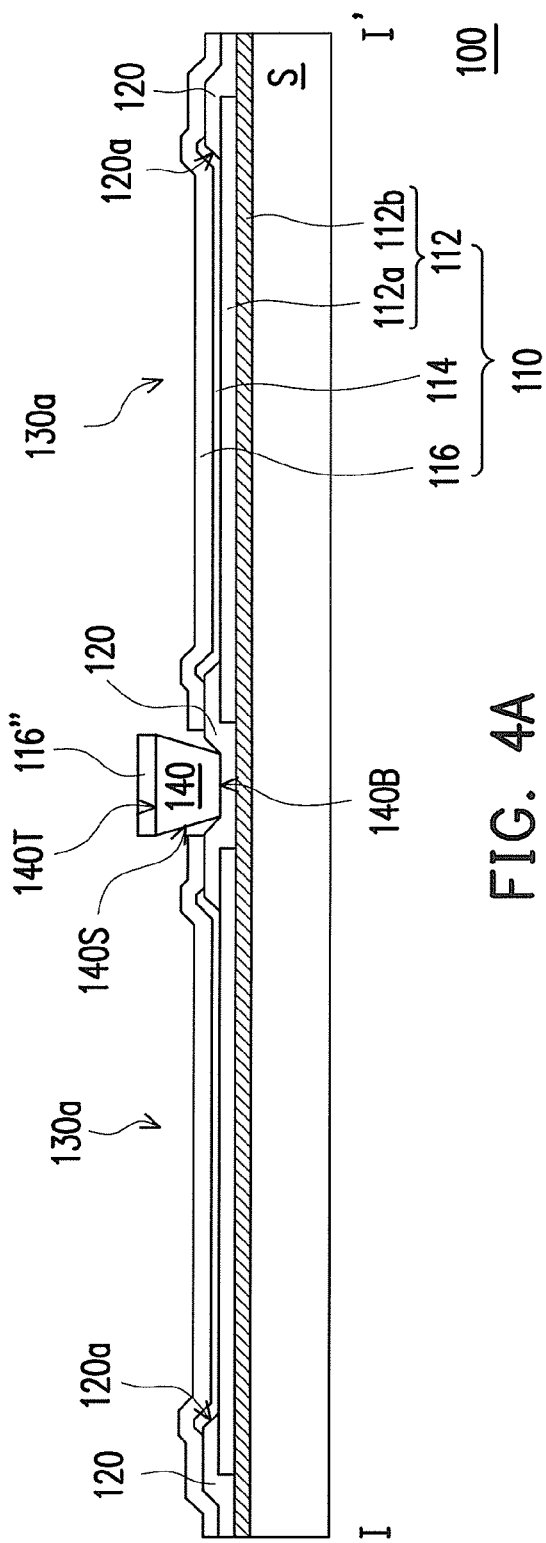
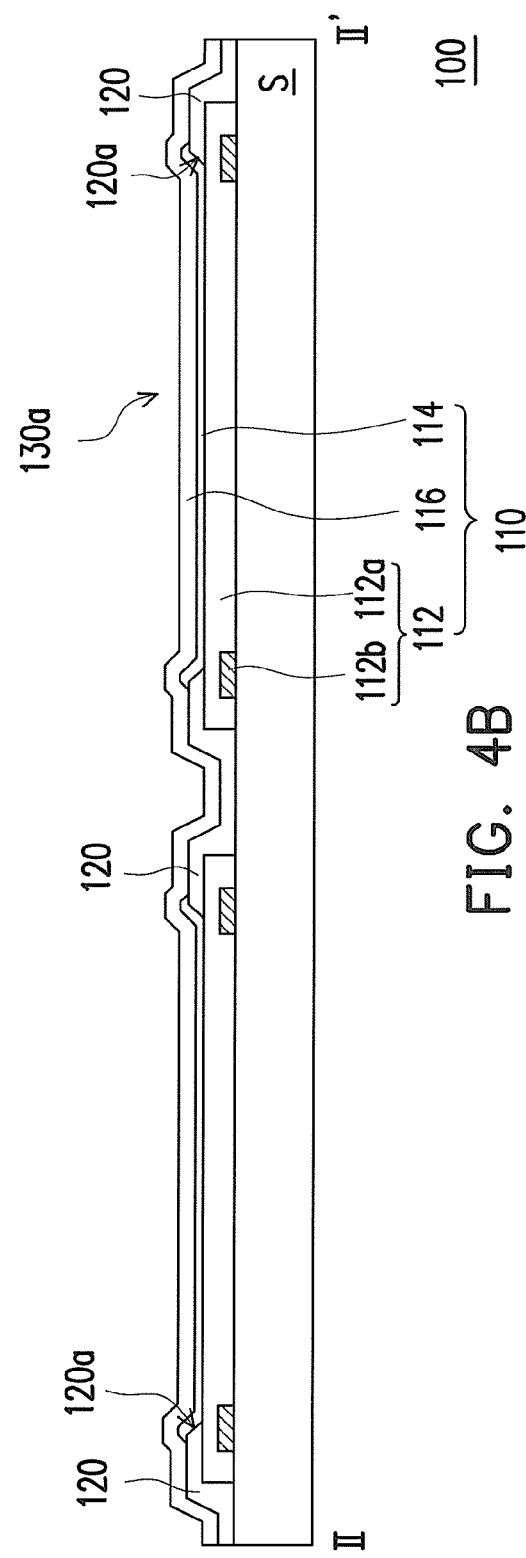
FIG. 4A
FIG. 4B

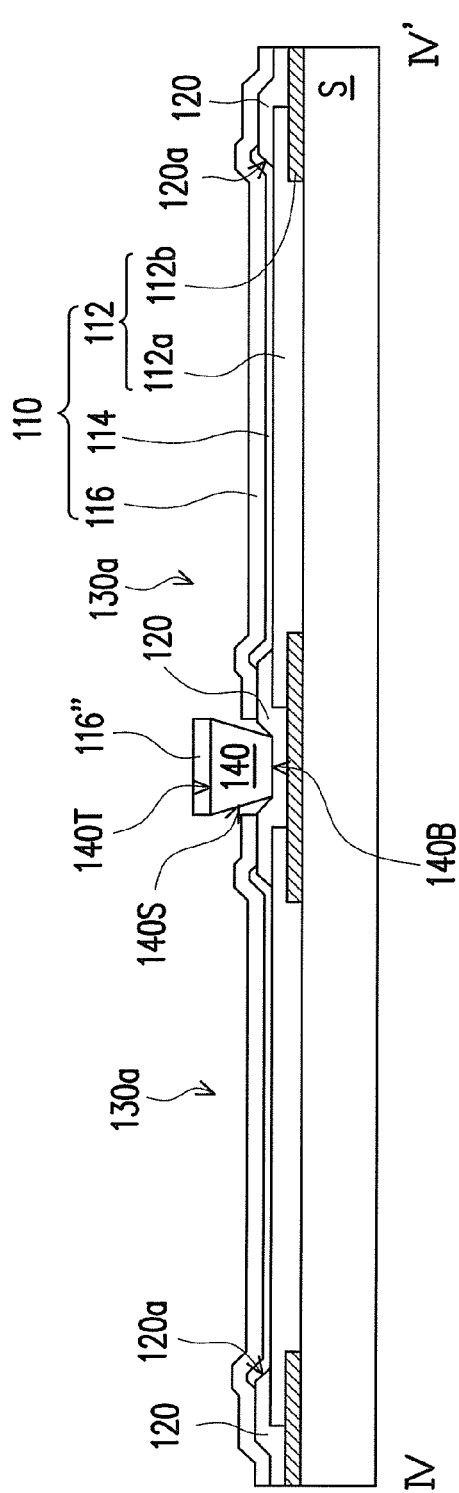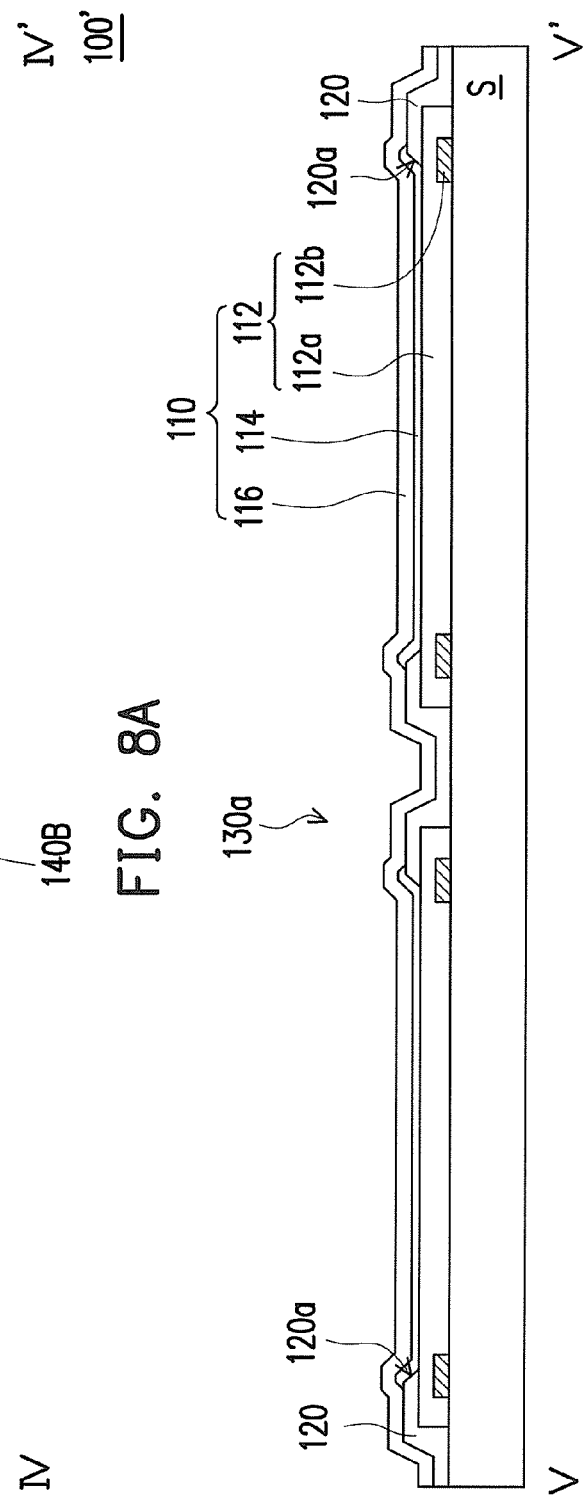
FIG. 8A
FIG. 8B

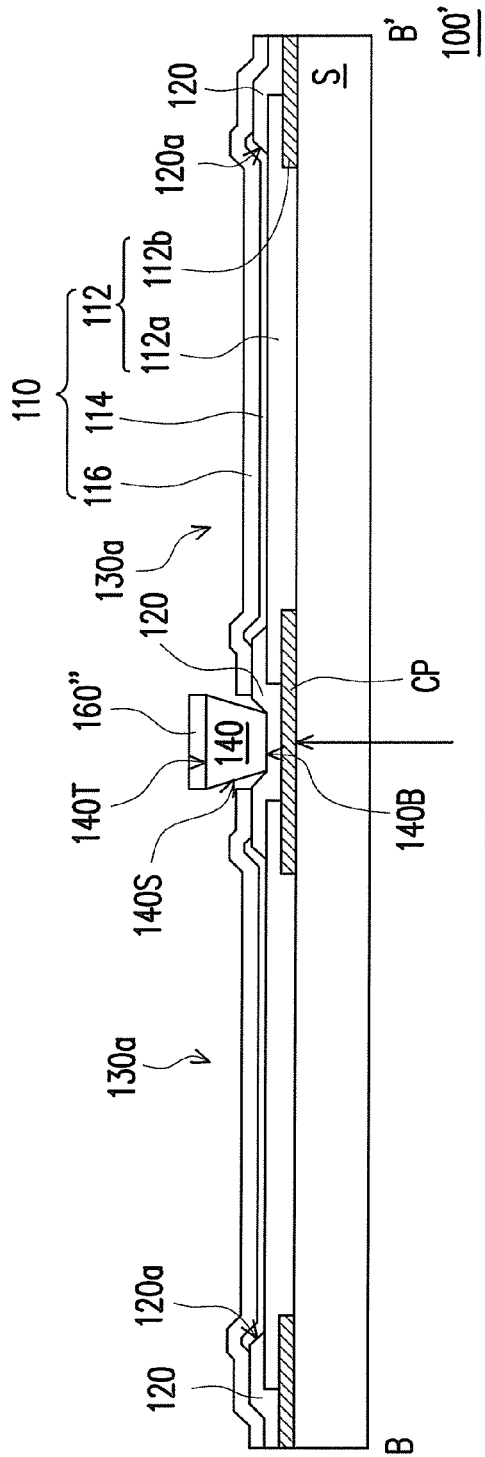
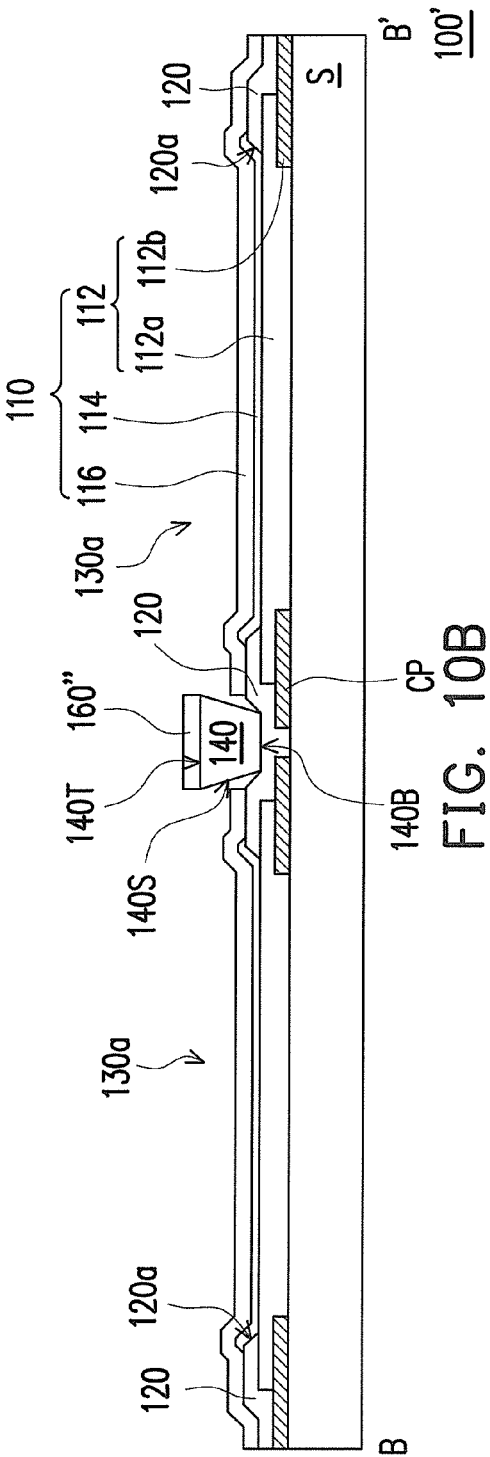
FIG. 10A
FIG. 10B

LIGHT-EMITTING DEVICE AND REPAIRING METHOD THEREOF

CROSS-REFERENCE TO RELATED APPLICATION

This application claims the priority benefit of Taiwan application serial no. 98124289, filed Jul. 17, 2009. The entirety of the above-mentioned patent application is hereby incorporated by reference herein and made a part of specification.

BACKGROUND OF THE INVENTION

1. Field of the Invention

The invention generally relates to a light-emitting device and a repairing method thereof. More particularly, the invention relates to a light-emitting device capable of being repaired easily and the repairing method thereof.

2. Description of Related Art

An Organic Light-Emitting Diode (OLED) is a self-emissive type light-emitting device used in displays or light sources. When the OLED is used for illumination, a capability to illuminate a large area is usually required. As shown in FIG. 1A, in order to provide a sufficient illumination area, manufacturers usually configure a plurality of OLEDs in a parallel to form a light-emitting device. When a terminal of the OLED is connected to a V+ voltage while another terminal is connected to GND, the OLED simultaneously emits light. However, as shown in FIG. 1B, when a cathode and an anode of one of the OLEDs are shorted, the driving current is conducted to GND due to the short circuit between the cathode and the anode, causing a lighting failure of the OLED.

As shown in FIG. 2A, instead of configuring a plurality of OLEDs in parallel, some manufacturers configure the OLEDs in series to form a light-emitting device that provides sufficient illumination area. As shown in FIG. 2B, when a cathode and an anode of one of the LEDs are shorted, the driving current can still be transmitted to other normally functioning OLEDs. Therefore, while the abnormal OLED fails to emit light, other normally functioning OLEDs are still lit. Nevertheless, as the number of serially connected OLEDs increases, a driving voltage required also increases. As shown in FIG. 2C, if the driving voltage required to drive a single OLED is V+, the driving voltage required to drive n OLEDs is n times V+.

Accordingly, the light-emitting devices depicted in FIGS. 1A and 2A have unsolved problems. How to improve the failed OLEDs without a drastic increase in driving voltage is one of the research issues for manufacturers.

SUMMARY OF THE INVENTION

The invention provides a light-emitting device and a repairing method thereof for effectively enhancing the yield of the light-emitting device.

The invention provides a light-emitting device including a plurality of light-emitting units. The light-emitting units are configured in series, and each of the light-emitting units includes a first common electrode layer, a plurality of light-emitting layers, and a second common electrode layer. The first common electrode layer includes a bridge conductive line and a plurality of first electrode patterns electrically insulated from each other, in which the first electrode patterns are electrically connected to each other through the bridge conductive line. Each of the light-emitting layers is respectively disposed on one of the first electrode patterns. The second common electrode layer is disposed on the light-emitting layers, and the first common electrode layer of each of the light-emitting units is respectively electrically connected with the second common electrode layer of an adjacent light-emitting unit.

In one embodiment of the invention, the aforementioned bridge conductive line includes a metal bridge conductive line.

In one embodiment of the invention, the aforementioned first electrode patterns include transparent first electrode patterns.

In one embodiment of the invention, the aforementioned light-emitting layers include organic light-emitting layers.

In one embodiment of the invention, the aforementioned light-emitting device further includes a passivation layer covering the first common electrode layer, in which the passivation layer includes a plurality of openings each respectively exposing at least a portion of one of the first electrode patterns, and each of the light-emitting layers is respectively disposed on one of the first electrode patterns exposed by the openings.

In one embodiment of the invention, the aforementioned passivation layer includes a plurality of contact openings, in which each of the contact openings respectively expose a portion of one of the first common electrode layer, and each of the second common electrode layers is respectively electrically connected with the adjacent first common electrode layer through one of the contact openings.

In one embodiment of the invention, each of the contact openings respectively expose at least one of the first electrode patterns in one of the first common electrode layers.

In one embodiment of the invention, the aforementioned light-emitting device further includes a first barrier rib having a plurality of openings for defining the light-emitting units. Each of the light-emitting units is respectively disposed in one of the openings for defining the light-emitting units, and through one of the contact openings, at least one of the first electrode patterns connected with the second common electrode layer is extended from one of the openings for defining the light-emitting units to an adjacent opening for defining the light-emitting unit.

In one embodiment of the invention, the aforementioned light-emitting device further includes at least one second barrier rib disposed in one of the openings for defining the light-emitting units, and the second barrier rib is disposed above the portion of the bridge conducting line not covered by the first electrode patterns.

In one embodiment of the invention, each of the bridge conductive lines disposed in different light-emitting units does not directly connect with each other.

In one embodiment of the invention, each of the bridge conductive lines include a plurality of annular conductive patterns and a plurality of connecting conductive patterns connected to the adjacent annular conductive patterns.

In one embodiment of the invention, the aforementioned annular conductive patterns are rectangular annular conductive patterns.

In one embodiment of the invention, each of the connecting conductive patterns is connected between linear portions of two adjacent rectangular annular conductive patterns.

In one embodiment of the invention, each of the connecting conductive patterns is connected to corner portions of two adjacent rectangular annular conductive patterns.

In one embodiment of the invention, the aforementioned light-emitting device further includes a first barrier rib having a plurality of openings for defining the light-emitting units. Each of the light-emitting units is respectively disposed in one of the openings for defining the light-emitting units, and through one of the contact openings, at least one of the first electrode patterns connected with the second common electrode layer is extended from one of the openings for defining the light-emitting units to an adjacent opening for defining the light-emitting unit.

In one embodiment of the invention, the aforementioned light-emitting device further includes at least one second barrier rib disposed in one of the openings for defining the light-emitting units, and the second barrier rib is disposed above the connecting conductive patterns.

Embodiments of the invention provide a repairing method for repairing the aforementioned light-emitting device, when at least one of the first electrode patterns of one of the light-emitting units and the second common electrode layer are shorted. The repairing method includes cutting a portion of the bridge conductive line, for electrically insulating the other first electrode patterns from the first electrode pattern shorted with the second common electrode layer.

In one embodiment of the invention, a cutting process of the bridge conductive line includes laser cutting.

In summary, embodiments of the invention use the bridge conductive line for connecting the first electrode patterns electrically insulated from each other to form the first common electrode layer, and thus the light-emitting device described by embodiments of the invention is more repairable.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A and 1B are circuit diagrams illustrating a conventional light-emitting device.

FIGS. 2A-2C are circuit diagrams illustrating another conventional light-emitting device.

FIG. 3' is a circuit diagram illustrating the light-emitting device in accordance with the first embodiment of the invention.

FIGS. 4A-4C are cross-sectional diagrams respectively illustrating an I-I' cross-section, an II-II' cross-section, and an III-III' cross-section of FIG. 3.

FIGS. 8A-8C are cross-sectional schematic diagrams respectively illustrating a IV-IV' cross-section, a V-V' cross-section, and a VI-VI' cross-section of FIG. 7.

FIGS. 10A-10B are cross-sectional schematic diagrams illustrating a B-B' cross-section of FIG. 9 during the repair process.

DESCRIPTION OF EMBODIMENTS

The First Embodiment

Figure 3:
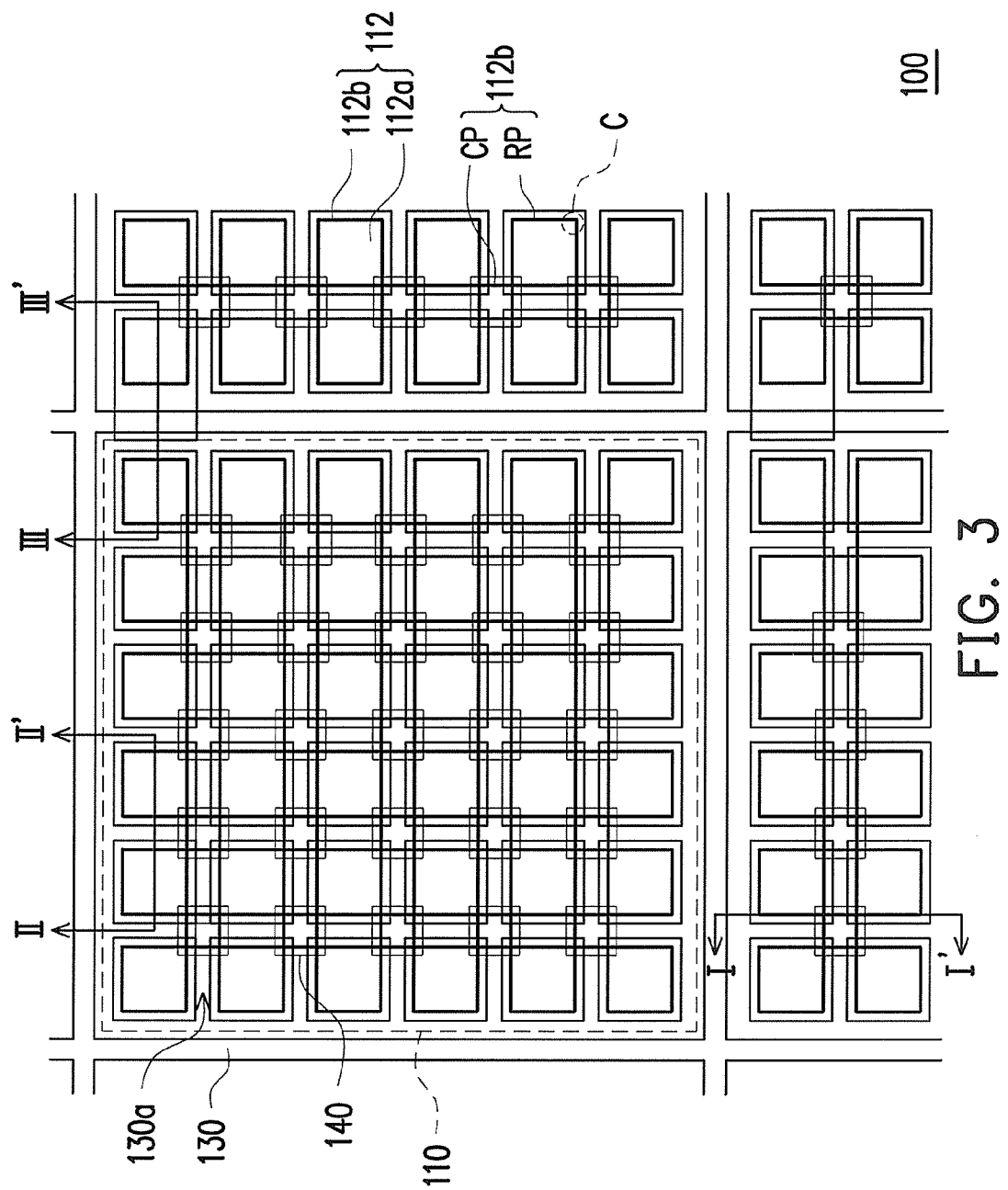
FIG. 3 is a schematic diagram illustrating a top view of a light-emitting device in accordance with a first embodiment of the invention.
Figure 4C:
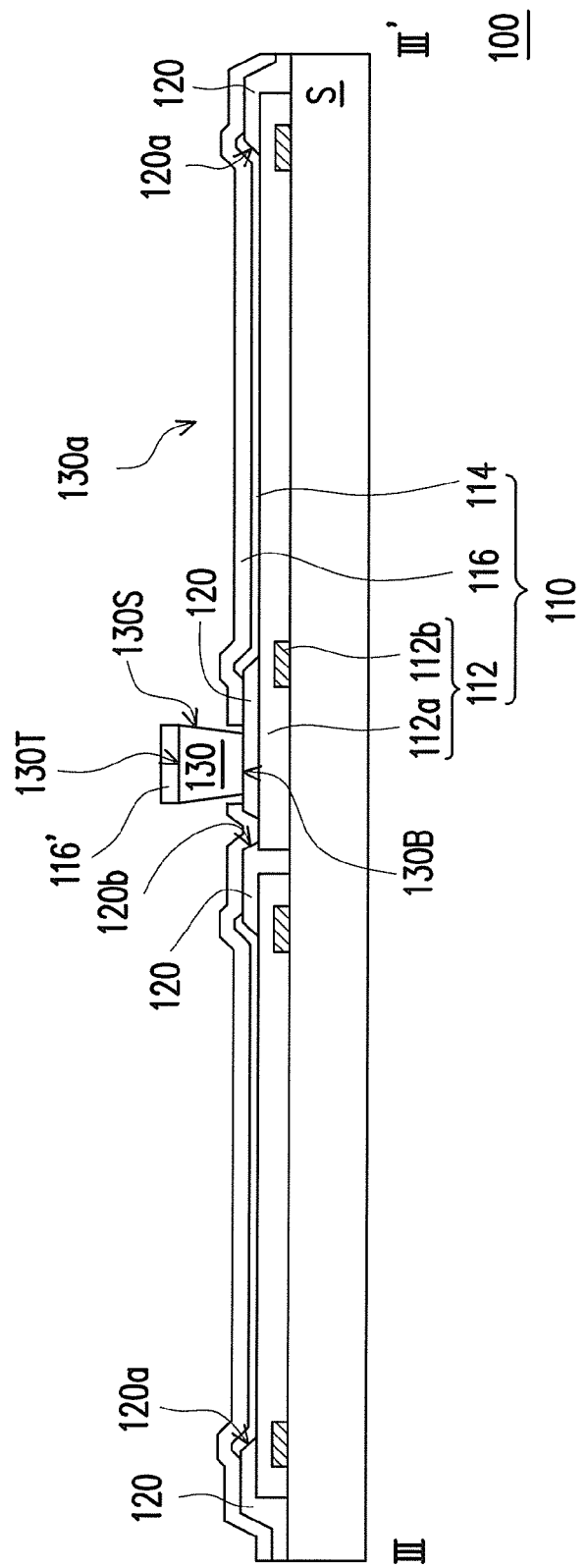

FIG. 3 is a schematic diagram illustrating a top view of a light-emitting device in accordance with a first embodiment of the invention. FIGS. 4A-4C are cross-sectional diagrams respectively illustrating an I-I' cross-section, an II-II' cross-section, and an III-III' cross-section of FIG. 3. Referring to FIGS. 3, 4A, 4B, and 4C, a light-emitting device 100 of the present embodiment of the invention includes a plurality of light-emitting units 110 arranged in an array. The light-emitting units 110 in the light-emitting device 100 are connected in series with each other. Each of the light-emitting units 110 includes a first common electrode layer 112, a plurality of light-emitting layers 114, and a second common electrode layer 116. For example, the first common electrode layer 112 is an anode whereas the second common electrode layer 116 is a cathode. In another example, the first common electrode layer 112 is the cathode whereas the second common electrode layer 116 is the anode. The first common electrode layer 112 includes a plurality of first electrode patterns 112a electrically insulated from each other and a bridge conductive line 112b. The first electrode patterns 112a cover a portion of the bridge conductive line 112b, and the first electrode patterns are electrically connected to each other through the bridge conductive line 112b. However, when required by a designer, the first electrode pattern 112a is formed on a substrate S, then the bridge conductive line 112b is formed on the first electrode patterns 112a. The first electrode patterns 112a are electrically connected to each other through the bridge conductive line 112b. Each of the light-emitting layers 114 is respectively disposed on one of the first electrode patterns 112a. The second common 116 is disposed on the light-emitting layers 114. The first common electrode layer 112 of each of the light-emitting units 110 is respectively electrically connected with the second common electrode layer of an adjacent light-emitting unit 110.

In the present embodiment of the invention, the first electrode patterns 112a of the first common electrode layer 112 can be a transparent conductive first electrode pattern comprising of materials such as indium tin oxide (ITO), indium zinc oxide (IZO), or other transparent conductive materials. The bridge conductive line 112b can be a metal bridge conductive line, and the bridge conductive lines 112b disposed in different light-emitting units 110 do not directly connect with each other. When the bridge conductive line 112b is a metal bridge conductive line, an overall resistance of the first common electrode layer 112 can be lowered. Moreover, the second common electrode layer 116 is comprised of metals or other conductive materials. More specifically, since the first common electrode layer 112 of the present embodiment of the invention has good light transmission characteristics, and the second common electrode layer 116 has good light reflection characteristics, the light rays emitted by the light-emitting units 110 are transmittable through the substrate S.

The light-emitting layers 114 can be an organic light-emitting layer, for example. The organic light-emitting layer can be fabricated with an ink jet printing process, an evaporation process, or other thin-film deposition techniques. As shown in FIG. 3', the light-emitting units 110 can be configured to have each of the light-emitting units 110 parallel connected to each other.

In the present embodiment of the invention, the light-emitting device 100 can further include a passivation layer 120 covering the first common electrode layer 112. The passivation layer 120 protects against a short circuit forming between the first common electrode layer 112 and the second common electrode layer 116 of a same light-emitting unit 110. As shown in FIGS. 4A-4C, the passivation layer 120 includes a plurality of openings 120a each respectively exposing a portion of each of the first electrode patterns 112a. Each of the light-emitting layers 114 is respectively disposed on one of the first electrode patterns 112a exposed by the openings 120a. More specifically, the openings 120a of the passivation layer 120 can be used to define the location of the light-emitting layers 114.

Furthermore, in order for the first common electrode layer 112 of each of the light-emitting units 110 to respectively electrically connect with the second common electrode layer 116 of an adjacent light-emitting unit 110, the passivation layer 120 can include a plurality of contact openings 120b. Each of the contact openings 120b respectively exposes a portion of one of the first common electrode layer 112. Additionally, each of the second common electrode layers 116 is respectively electrically connected with the adjacent first common electrode layer 112 through one of the contact openings 120b. In the present embodiment of the invention, each of the contact openings 120b respectively exposes at least one of the first electrode patterns 112a in one of the first common electrode layer 112. It should be noted that the protection of the electrical connection between the first common electrode layer 112 and the second common electrode layer 116 can be made more secure by increasing the number of the contact openings 120b, increasing the area of the contact openings 120b, or increasing the number of the first electrode patterns 112a connected with the second common electrode layer 116.

In order to define the light-emitting units 110 in the light-emitting device 100, the light-emitting device 100 of the present embodiment of the invention can further include a first barrier rib 130. The first barrier rib 130 includes a plurality of openings 130a defining the light-emitting units, and each of the light-emitting units 110 is respectively disposed in one of the openings 130a defining the light-emitting units. Additionally, through one of the contact openings 120b, at least one of the first electrode patterns 112a connected with the second common electrode layer 120b is extended from one of the openings 130a defining the light-emitting units to an adjacent opening 130a defining the light-emitting units. As shown in FIG. 3, the first barrier rib 130 has a meshed shape. Additionally, the first barrier rib 130 is interlaced with at least one of the first electrode patterns 112a which is connected to the second common electrode layer 116 through one of the contact openings 120b.

As shown in FIGS. 4A-4C, the first barrier rib 130 is disposed on the passivation layer 120, and the first barrier rib 130 has a top surface 130T, a bottom surface 130B in contact with the passivation layer 120, and a plurality slanted side surfaces 130S connected to the top surface 130T and the bottom surface 130B. The area of the top surface 130T is larger than the area of the bottom surface 130B.

When the area of the top surface 130T is larger than the area of the bottom surface 130B, the second common electrode layer 116 of each of the light-emitting units 110 naturally severs and the second common electrode layers 116 become insulated from each other. Moreover, a material layer 116' comprised of the same material as the second common electrode layer 116 is disposed on the top surface 130T.

In the present embodiment of the invention, the light-emitting device 100 can further include at least one second barrier rib 140. The second barrier rib 140 is disposed in the openings 130a defining light-emitting units, and the second barrier rib 140 is disposed above the portion of the bridge conducting line 112b that is not covered by the first electrode patterns 112a. Similarly, the second barrier rib 140 has a top surface 140T, a bottom surface 140B in contact with the passivation layer 120, and a plurality slanted side surfaces 140S connected to the top surface 140T and the bottom surface 140B. The area of the top surface 140T is larger than the area of the bottom surface 140B. Moreover, a material layer 116" comprised of the same material as the second common electrode layer 116 is disposed on the top surface 140T. For example, the second barrier rib 140 can be fabricated together with the first barrier rib 130, and therefore the material of the second barrier rib 140 is the same as the material of the first barrier rib 130 (e.g., a light resistant material, a metal and oxygen insulating material, or the like).

As shown in FIG. 3, each bridge conductive line 112b includes a plurality of annular conductive patterns RP and a plurality of connecting conductive patterns CP connected between the annular conductive patterns RP. The annular conductive patterns RP are rectangular annular conductive patterns. Each of the connecting conductive patterns CP is connected to corner portions C of two adjacent rectangular annular conductive patterns RP.

Figure 5:
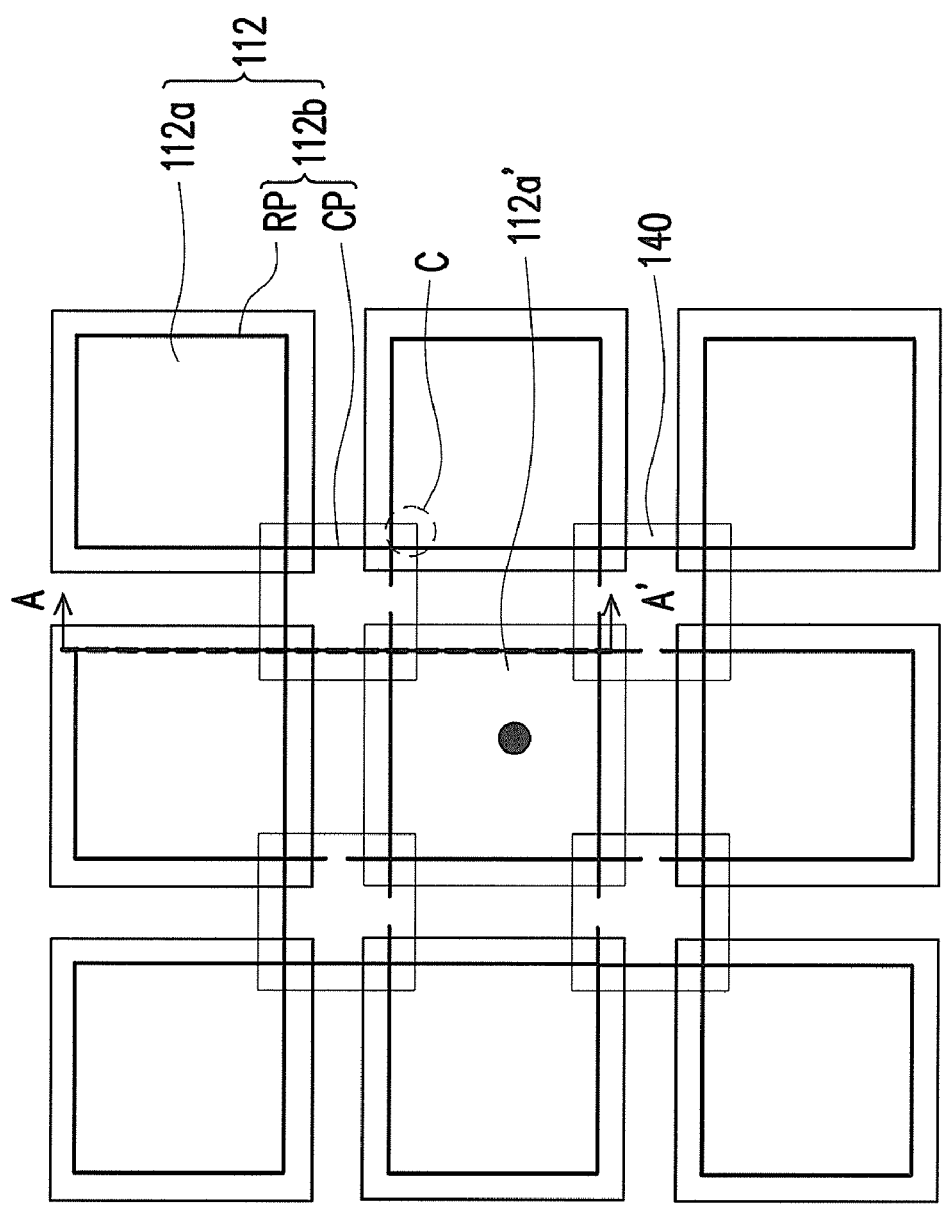
FIG. 5 is a schematic diagram illustrating a top view of the light-emitting device after repair.
Figure 6:
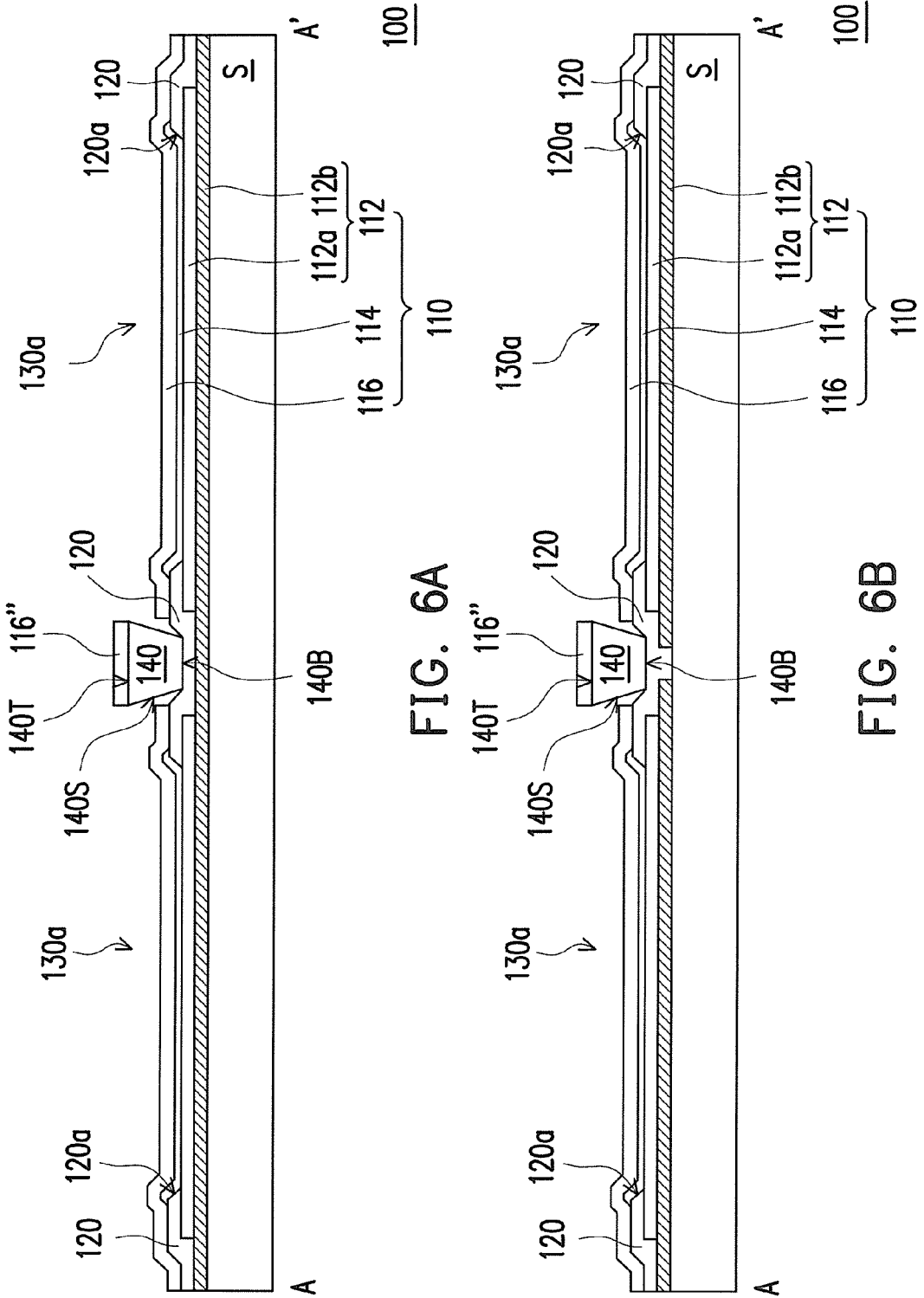
FIGS. 6A-6B are cross-sectional schematic diagrams illustrating a A-A' cross-section of FIG. 5 during a repair process.

FIG. 5 is a schematic diagram illustrating a top view of the light-emitting device after repair. FIGS. 6A-6B are cross-sectional schematic diagrams illustrating a A-A' cross-section of FIG. 5 during a repair process. Referring to FIGS. 5, 6A, and 6B, when one of the first electrode patterns 112a' of the light-emitting units 110 and the second common electrode layer 116 (depicted by a black dot in FIG. 5) are shorted, the present embodiment of the invention cuts a portion of the bridge conductive line 112b so that other first electrode patterns 112a are electrically insulated from the first electrode pattern 112a' shorted with the second common electrode layer 116. More specifically, the present embodiment of the invention can use a laser cutting process to cut the connecting conductive patterns CP surrounding the first electrode pattern 112a'. In order to provide electrical insulation between the first electrode pattern 112a' and the other first electrode patterns 112a in this area, 8 connecting conductive patterns CP need to be cut. After the above-described repair process, the light-emitting layers 114 above the other first electrode patterns 112a can be driven to emit light. Hence, the light-emitting units 110 in the present embodiment of the invention are protected against lighting failure.

The Second Embodiment

Figure 7:
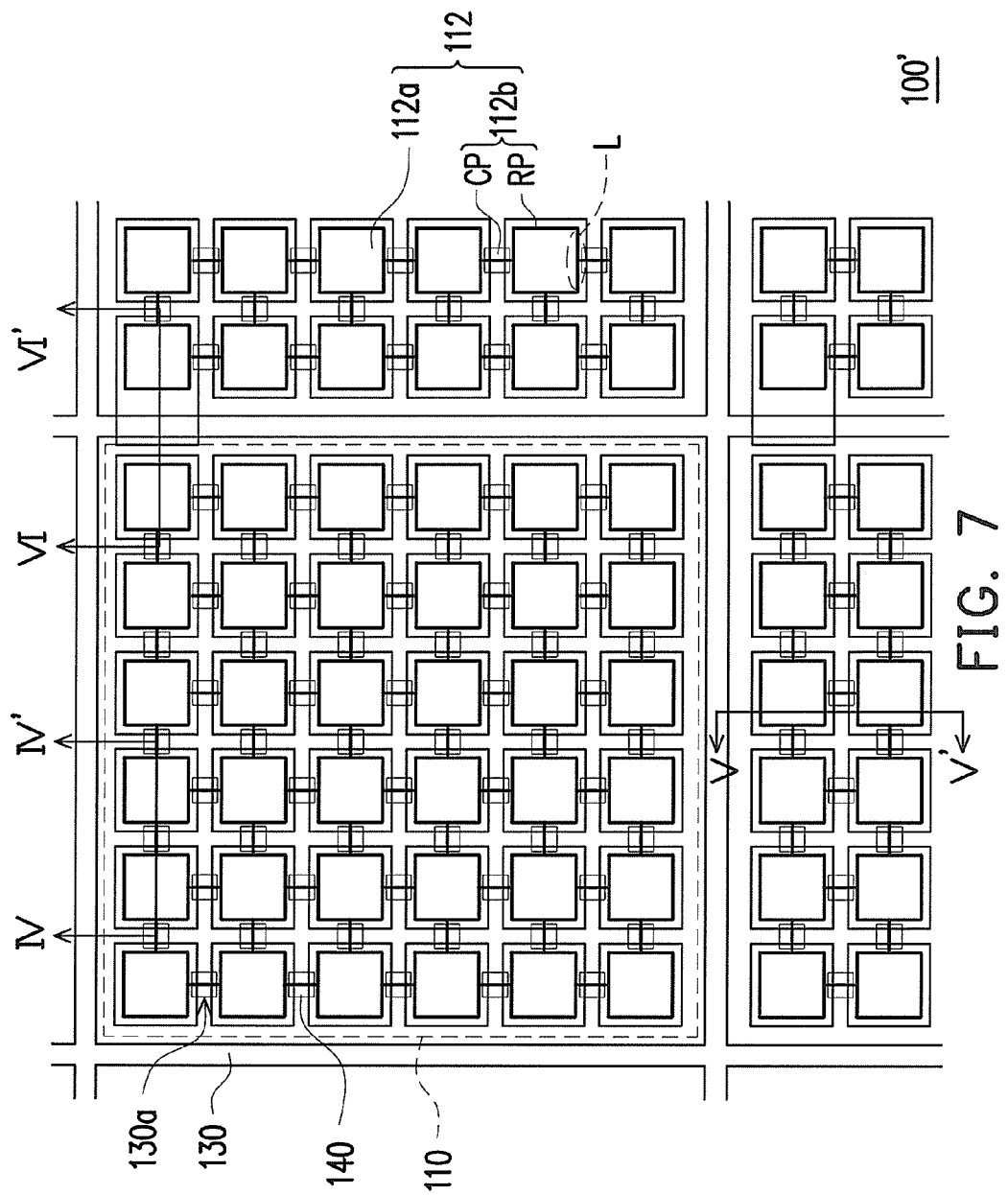
FIG. 7 is a schematic diagram illustrating a top view of the light-emitting device in accordance with a second embodiment of the invention.
Figure 8C:
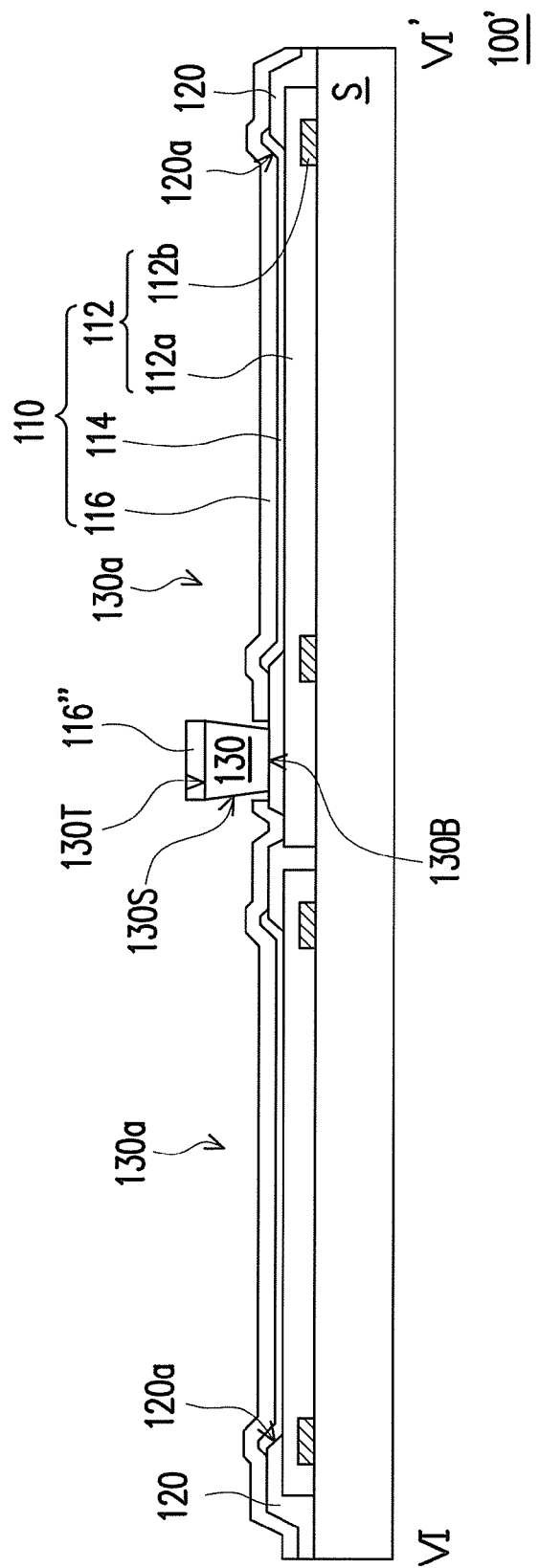

FIG. 7 is a schematic diagram illustrating a top view of the light-emitting device in accordance with a second embodiment of the invention. FIGS. 8A-8C are cross-sectional schematic diagrams respectively illustrating a IV-IV' cross-section, a V-V' cross-section, and a VI-VI' cross-section of FIG. 7. Referring to FIGS. 7, 8A, 8B, and 8C, an light-emitting device 100' in the present embodiment of the invention is similar to the light-emitting device 100 (depicted in FIGS. 3, 4A, 4B, and 4C). The annular conductive patterns RP in the present embodiment of the invention are rectangular annular conductive patterns. A difference between the two light-emitting devices is that each of the connecting conductive patterns CP is connected with linear portions L of two adjacent rectangular annular conductive patterns RP.

Figure 9:
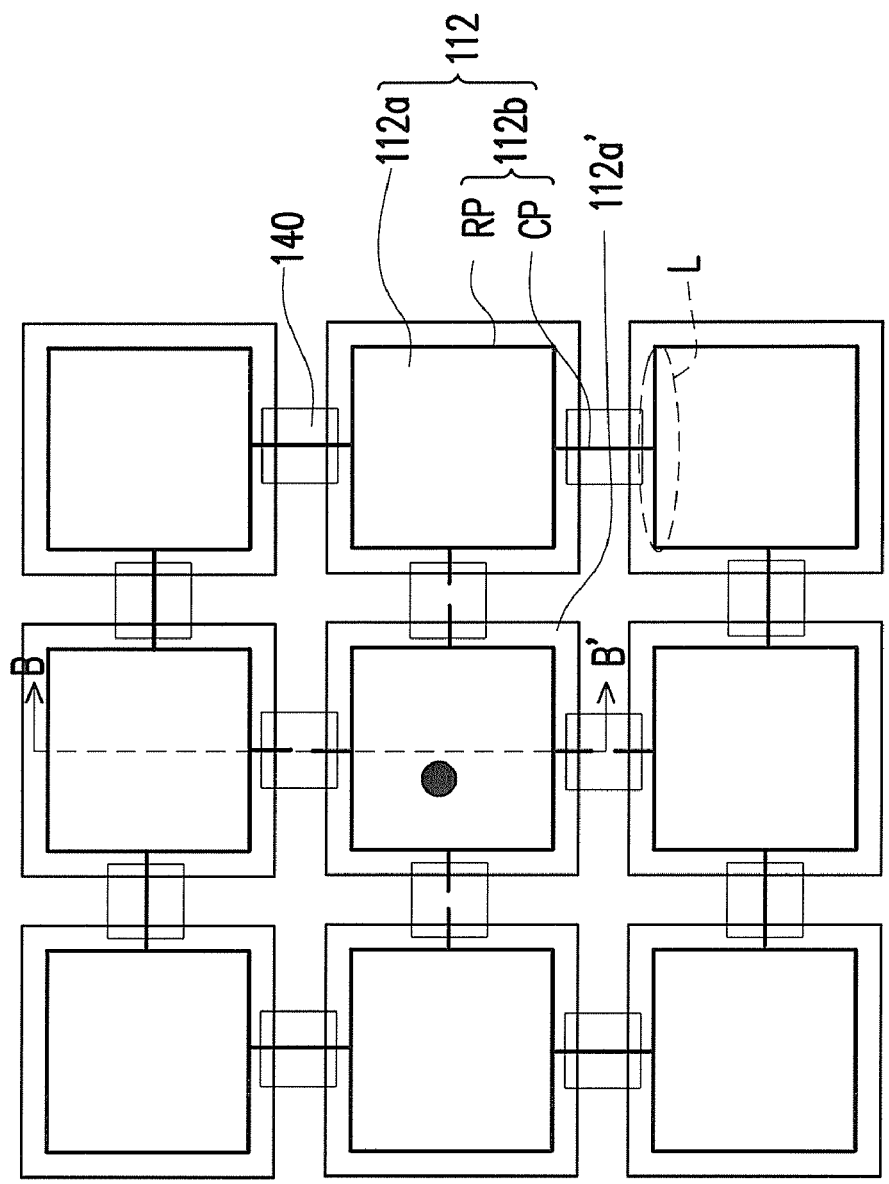
FIG. 9 is a schematic diagram illustrating a top view of the light-emitting device after repair.

FIG. 9 is a schematic diagram illustrating a top view of the light-emitting device after repair. FIGS. 10A-10B are cross-sectional schematic diagrams illustrating a B-B' cross-section of FIG. 9 during the repair process. Referring to FIGS. 9, 10A, and 10B, when one of the first electrode patterns 112a' of the light-emitting units 110 and the second common electrode layer 116 (depicted by the black dot in FIG. 9) are shorted, the present embodiment of the invention cuts a portion of the bridge conductive line 112b so that the first electrode pattern 112a' shorted with the second common electrode layer 116 is electrically insulated from the other first electrode patterns 112a. More specifically, the present embodiment of the invention can use the laser cutting process to disable the connecting conductive patterns CP surrounding the first electrode pattern 112a'. In order to provide electrical insulation between the first electrode pattern 112a' and the other first electrode patterns 112a in this area, 4 connecting conductive patterns CP need to be cut. After the above-described repair process, the light-emitting layers 114 above the other first electrode patterns 112a can be driven to emit light. Hence, the light-emitting units 110 in the present embodiment of the invention are protected against lighting failure.

Accordingly, since an easily repairable structure is used in embodiments of the invention for the first common electrode layer, a higher yield can be achieved for the light-emitting devices described in the embodiments by utilizing suitable repair fabrication processes.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A light-emitting device, comprising:
 a plurality of light-emitting units connected with each other, each of the light-emitting units comprising:
  a first common electrode layer comprising a bridge conductive line and a plurality of first electrode patterns electrically insulated from each other, wherein the first electrode patterns are electrically connected to each other through the bridge conductive line;
  a plurality of light-emitting layers separate from each other, wherein each of the light-emitting layers is respectively disposed on one of the first electrode patterns; and
  a second common electrode layer disposed on the light-emitting layers, wherein the first common electrode layer of each of the light-emitting units is respectively electrically connected with the second common electrode layer of an adjacent light-emitting unit, wherein the second common electrode layer of each one of the light-emitting units covers the plurality of light-emitting layers separate from each other.

2. The light-emitting device as claimed in claim 1, wherein the bridge conductive line includes a metal bridge conductive line.

3. The light-emitting device as claimed in claim 1, wherein the first electrode patterns comprise transparent conductive first electrode patterns.

4. The light-emitting device as claimed in claim 1, wherein the light-emitting layers comprise organic light-emitting layers.

5. The light-emitting device as claimed in claim 1, further comprising a passivation layer covering the first common electrode layer, wherein the passivation layer includes a plurality of openings each respectively exposing at least a portion of one of the first electrode patterns, and each of the light-emitting layers is respectively disposed on one of the first electrode patterns exposed by the openings.

6. The light-emitting device as claimed in claim 5, wherein the passivation layer includes a plurality of contact openings, each of the contact openings respectively exposes a portion of one of the first common electrode layer, and each of the second common electrode layers is respectively electrically connected with the adjacent first common electrode layer through one of the contact openings.

7. The light-emitting device as claimed in claim 6, wherein each of the contact openings respectively exposes at least one of the first electrode patterns in one of the first common electrode layers.

8. The light-emitting device as claimed in claim 7, further comprising a first barrier rib, wherein the first barrier rib includes a plurality of openings for defining the light-emitting units, each of the light-emitting units is respectively disposed in one of the openings for defining the light-emitting units, and through one of the contact openings, at least one of the first electrode patterns connected with the second common electrode layer is extended from one of the openings for defining the light-emitting units to an adjacent opening for defining the light-emitting unit.

9. The light-emitting device as claimed in claim 8, further comprising at least one second barrier rib disposed in one of the openings for defining the light-emitting units, and the second barrier rib is disposed above a portion of the bridge conducting line not covered by the first electrode patterns.

10. A repairing method for repairing the light-emitting device of claim 9, when at least one of the first electrode patterns of one of the light-emitting units and the second common electrode layer are shorted, the repairing method comprising:
 cutting a portion of the bridge conductive line disposed below the second barrier rib, for electrically insulating the other first electrode patterns from the first electrode pattern shorted with the second common electrode layer.

11. The repairing method as claimed in claim 10, wherein the step of cutting a portion of the bridge conductive line includes laser cutting.

12. The light-emitting device as claimed in claim 1, wherein each of the bridge conductive lines disposed in different light-emitting units does not directly connect with each other.

13. The light-emitting device as claimed in claim 1, wherein each of the bridge conductive lines comprises:
 a plurality of annular conductive patterns; and
 a plurality of connecting conductive patterns connected to the adjacent annular conductive patterns.

14. The light-emitting device as claimed in claim 13, wherein each of the annular conductive patterns is a rectangular annular conductive pattern.

15. The light-emitting device as claimed in claim 14, wherein each of the connecting conductive patterns is connected between linear portions of two adjacent rectangular annular conductive patterns.

16. The light-emitting device as claimed in claim 14, wherein each of the connecting conductive patterns is connected to corner portions of two adjacent rectangular annular conductive patterns.

17. The light-emitting device as claimed in claim 13, further comprising a first barrier rib, wherein the first barrier rib includes a plurality of openings for defining the light-emitting units, each of the light-emitting units is respectively disposed in one of the openings for defining the light-emitting units, and through one of the contact openings, at least one of the first electrode patterns connected with the second common electrode layer is extended from one of the openings for defining the light-emitting units to an adjacent opening for defining the light-emitting unit.

18. The light-emitting device as claimed in claim 13, further comprising at least one second barrier rib disposed in one of the openings for defining the light-emitting units, and the second barrier rib is disposed above the connecting conductive patterns.

19. A repairing method for repairing the light-emitting device of claim 18, when at least one of the first electrode patterns of one of the light-emitting units and the second common electrode layer are shorted, the repairing method comprising:
   cutting a portion of the bridge conductive line disposed below the second barrier rib, for electrically insulating the other first electrode patterns from the first electrode pattern shorted with the second common electrode layer.

20. The repairing method as claimed in claim 19, wherein the step of cutting a portion of the bridge conductive line includes laser cutting.

21. A repairing method for repairing the light-emitting device of claim 13, when at least one of the first electrode patterns of one of the light-emitting units and the second common electrode layer are shorted, the repairing method comprising:
   cutting a portion of the connecting conductive patterns, for electrically insulating the other first electrode patterns from the first electrode pattern shorted with the second common electrode layer.

22. The repairing method as claimed in claim 21, wherein the step of cutting a portion of the connecting conductive patterns includes laser cutting.

23. A repairing method for repairing the light-emitting device of claim 1, when at least one of the first electrode patterns of one of the light-emitting units and the second common electrode layer are shorted, the repairing method comprising:
   cutting a portion of the bridge conductive line, for electrically insulating the other first electrode patterns from the first electrode pattern shorted with the second common electrode layer.

24. The repairing method as claimed in claim 23, wherein the step of cutting a portion of the bridge conductive line includes laser cutting.

25. The repairing method as claimed in claim 23, wherein the bridge conductive line is overlapped with at least parts of the plurality of the first electrodes.

* * * * *